United States Patent
Suga (10) Patent No.: US 8,951,888 B2
(45) Date of Patent: Feb. 10, 2015

(54) METHOD FOR FABRICATING SEMICONDUCTOR DEVICE, AND METHOD FOR FABRICATING DISPLAY DEVICE

(75) Inventor: Katsuyuki Suga, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 286 days.

(21) Appl. No.: 13/703,999

(22) PCT Filed: May 23, 2011

(86) PCT No.: PCT/JP2011/002855
§ 371 (c)(1),
(2), (4) Date: Dec. 13, 2012

(87) PCT Pub. No.: WO2011/158438
PCT Pub. Date: Dec. 22, 2011

(65) Prior Publication Data
US 2013/0089933 A1    Apr. 11, 2013

(30) Foreign Application Priority Data
Jun. 14, 2010    (JP) ................................. 2010-134935

(51) Int. Cl.
*H01L 21/00* (2006.01)
*H01L 33/00* (2010.01)
*H01L 27/12* (2006.01)

(52) U.S. Cl.
CPC ........ *H01L 33/0095* (2013.01); *H01L 27/1214* (2013.01); *H01L 27/1266* (2013.01); *Y10S 414/135* (2013.01)
USPC ............... 438/458; 438/22; 438/99; 438/106; 257/E21.705; 414/935; 445/24

(58) Field of Classification Search
USPC .................... 438/458; 257/E21.705; 445/24; 414/935
See application file for complete search history.

(56) References Cited

U.S. PATENT DOCUMENTS 6,559,905 B1    5/2003   Akiyama
6,759,277 B1    7/2004   Flores et al.
(Continued)

FOREIGN PATENT DOCUMENTS

JP    11-024106 A    1/1999
JP    11-142878 A    5/1999
(Continued)

OTHER PUBLICATIONS

Official Communication issued in International Patent Application No. PCT/JP2011/002855, mailed on Aug. 30, 2011.

*Primary Examiner* — Ha Tran T Nguyen
*Assistant Examiner* — Aaron Dehne
(74) *Attorney, Agent, or Firm* — Keating & Bennett, LLP (57) ABSTRACT

A method for fabricating a semiconductor device includes a first step of forming, on a first substrate, a first element region in which a plurality of elements are collectively arranged, a second step of relocating the plurality of elements formed on the first substrate to a holding member in the same arrangement as in the first element region to have the plurality of elements held on the holding member, a third step of rearranging the plurality of elements held on the holding member and having the plurality of elements held on an intermediate substrate, thereby forming a second element region having a shape different from a shape of the first element region on the intermediate substrate, and a fourth step of dispersing the plurality of elements held on the intermediate substrate and adhering the plurality of elements to a second substrate.

14 Claims, 7 Drawing Sheets

(56) References Cited

U.S. PATENT DOCUMENTS

| | | |
|---|---|---|
| 2003/0011377 A1 | 1/2003 | Oohata et al. |
| 2003/0094619 A1 | 5/2003 | Akiyama |
| 2003/0162463 A1 | 8/2003 | Hayashi et al. |
| 2004/0201789 A1* | 10/2004 | Akiyama ................. 349/43 |
| 2004/0238851 A1* | 12/2004 | Flores et al. ............ 257/202 |
| 2009/0053876 A1* | 2/2009 | Yamazaki ............... 438/458 |

FOREIGN PATENT DOCUMENTS

| | | |
|---|---|---|
| JP | 2001-007340 A | 1/2001 |
| JP | 2002-314052 A | 10/2002 |
| JP | 2002-366054 A | 12/2002 |
| JP | 2004-260170 A | 9/2004 |
| JP | 2009-54661 A | 3/2009 |

\* cited by examiner

METHOD FOR FABRICATING SEMICONDUCTOR DEVICE, AND METHOD FOR FABRICATING DISPLAY DEVICE

TECHNICAL FIELD

The present disclosure relates to methods for fabricating a semiconductor device, and methods for fabricating a display device.

BACKGROUND ART

Element substrates as semiconductor devices which include a plurality of elements, such as light-emitting diodes (hereinafter referred to as "LEDs") and thin film transistors (hereinafter referred to as "TFTs"), dispersed on a substrate with predetermined intervals from one another have been known. For example, an active matrix type liquid crystal display device includes an element substrate on which a plurality of TFTs are arranged in a matrix.

It has been known to fabricate a relatively large element substrate by dispersing elements which are highly integrated and adhering them to a large area. For example, with an increase in size of liquid crystal display devices, etc., the above element substrate is also being increased in size.

Patent Document 1 discloses a step of integrating a plurality of TFT elements on a first substrate made of a Si substrate, a step of adhering the first substrate on which the TFT elements are formed to a holding member, and then etching the first substrate so that the TFT elements are left on the holding member, and a step of selectively relocating the TFT elements on the holding member from the holding member to a second substrate, thereby dispersing the TFT elements on the second substrate. This is intended to disperse a plurality of elements on a relatively large substrate at low cost.

Patent Document 2 discloses that if one of the elements dispersed on the second substrate is an faulty element, a normal element is placed on the faulty element in a stacked manner to connect the normal element to a wire circuit on the second substrate, thereby repairing the fault in the device as a whole.

CITATION LIST

Patent Document

Patent Document 1: Japanese Patent Application No. H11-142878
Patent Document 2: Japanese Patent Application No. 2002-366054

SUMMARY OF THE INVENTION

Technical Problem

Figure 16:
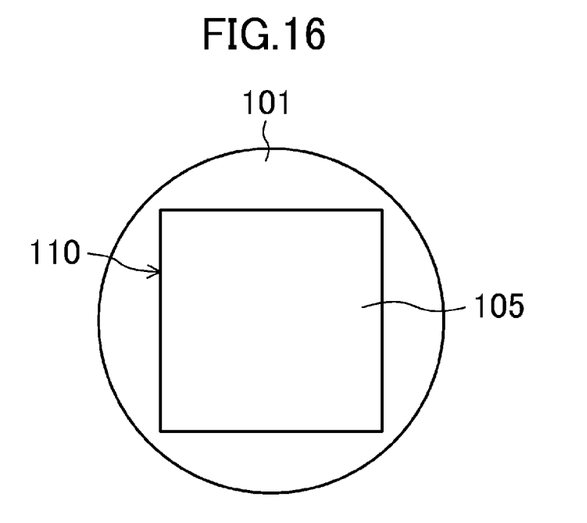
FIG. 16 is a plan view of a conventional wafer as a first substrate on which a plurality of elements are integrated.
Figure 17:
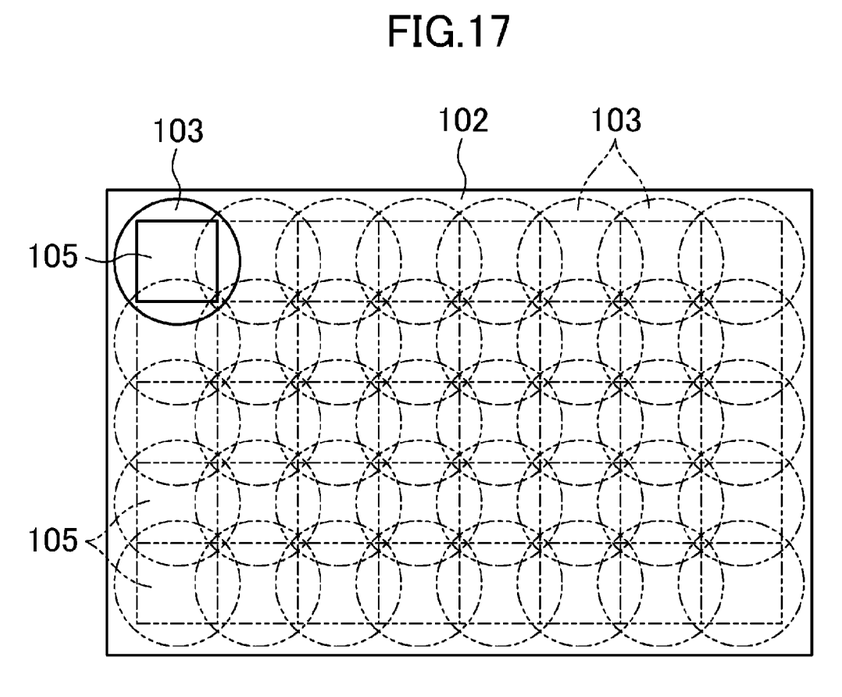
FIG. 17 is a plan view showing a holding member to which a plurality of elements are attached, and a second substrate to which the elements are selectively relocated.

FIG. 16 is a plan view of a wafer as a conventional first substrate on which a plurality of elements are integrated. FIG. 17 is a plan view showing a holding member to which a plurality of elements are adhered, and a second substrate to which the elements are selectively relocated.

According to the method disclosed in Patent Document 1, as described above, a plurality of elements 105 formed on a first substrate 101 are adhered to a holding member 103 in the same arrangement as on the first substrate 101, and thereafter, the holding member 103 is moved and positioned to selectively relocate the elements from the holding member 103 to the second substrate 102 as shown in FIG. 16 and FIG. 17.

Thus, a region of the first substrate 101 where the elements are formed (hereinafter referred to as an element region 110) is limited to a rectangular region whose size is 1/n (where n is a natural number) of the entire part of a region of the second substrate where the elements are eventually placed. Moreover, since the wafer as the first substrate 101 is in a circular shape, the first substrate 101 cannot be sufficiently used as the element region 110, and a relatively large area of the first substrate 101 is left unused as the element region 110 as shown in FIG. 16. As a result, it is difficult to reduce the fabrication cost.

Further, since the wafer as the first substrate 101 is relatively small in size, the number of movements of positioning and relocating the elements held on the holding member 103 from the holding member 103 to the second substrate 102 in the same arrangement as on the first substrate 101, is increased. This may lead to a reduction in the throughput.

The present disclosure is made in view of the above problems, and it is a main objective of the present disclosure to efficiently use a first substrate to reduce the fabrication costs and improve the throughput when fabricating a semiconductor device by dispersing, on a second substrate, a plurality of elements formed collectively on the first substrate.

Solution to the Problem

To achieve the above objective, a method for fabricating a semiconductor device according to the present disclosure is a method for fabricating a semiconductor device in which a plurality of elements are dispersed, and includes a first step of forming, on a first substrate, a first element region in which the plurality of elements are collectively arranged; a second step of relocating the plurality of elements formed on the first substrate to a holding member in the same arrangement as in the first element region to have the plurality of elements held on the holding member; a third step of rearranging the plurality of elements held on the holding member and having the plurality of elements held on an intermediate substrate, thereby forming a second element region having a shape different from a shape of the first element region on the intermediate substrate; and a fourth step of dispersing the plurality of elements held on the intermediate substrate and adhering the plurality of elements to a second substrate.

Further, a method for fabricating a display device according to the present disclosure is a method for fabricating a display device which includes forming an element substrate in which a plurality of elements are dispersed, and adhering a counter substrate to the element substrate to face the element substrate, wherein the forming the element substrate includes a first step of forming, on a first substrate, a first element region in which the plurality of elements are collectively arranged, a second step of relocating the plurality of elements formed on the first substrate to a holding member in the same arrangement as in the first element region to have the plurality of elements held on the holding member, a third step of rearranging the plurality of elements held on the holding member and having the plurality of elements held on an intermediate substrate, thereby forming a second element region having a shape different from a shape of the first element region on the intermediate substrate, and a fourth step of dispersing the plurality of elements held on the intermediate substrate and adhering the plurality of elements to a second substrate.

—Effects—

Next, effects of the present disclosure will be described.

According to the above method for fabricating the semiconductor device, a first element region in which a plurality of elements are collectively arranged is formed on the first substrate in the first step. For example, any one of a thin film transistor, a circuit including the thin film transistor, a light emitting element, a light receiving element, a power generating element, and a piezoelectric element, or an element or a circuit comprised of a combination of two or more of the thin film transistor, the circuit including the thin film transistor, the light emitting element, the light receiving element, the power generating element, and the piezoelectric element may be used as each of the elements.

In the second step, the plurality of elements formed on the first substrate are relocated to a holding member in the same arrangement as in the first element region to have the plurality of elements held on the holding member.

In the third step, the plurality of elements held on the holding member are rearranged and held on an intermediate substrate, thereby forming a second element region having a shape different from a shape of the first element region on the intermediate substrate. For example, a wafer in a circular shape, etc., may be used as the first substrate, and the intermediate substrate may be in a rectangular shape that is different from the shape of the first substrate. In this case, the first element region may be formed in a substantially circular shape, and the second element region may be formed in a rectangular shape. This means that according to the present disclosure, the shape of the first element region can be decided irrespective of the shape of the second element region, and therefore, it is possible to reduce an empty region on the first substrate where no element is formed, and possible to form the elements on a larger area of the first substrate with efficiency. As a result, the first substrate can be efficiently used, and the fabrication cost can be reduced.

After that, in the fourth step, the plurality of elements held on the intermediate substrate are dispersed and adhered to a second substrate. A semiconductor device is formed in this manner by efficiently using the first substrate to reduce the fabrication cost, and improve the throughput.

Further, the above method for fabricating the display device includes forming an element substrate as a semiconductor device by the method described above, and adhering a counter substrate to the element substrate to face the element substrate. As a result, a display device having the element substrate is formed.

Advantages of the Invention

According to the present disclosure, it is possible to efficiently use a first substrate to reduce the fabrication cost and improve the throughput when fabricating a semiconductor device by dispersing, on a second substrate, a plurality of elements formed collectively on the first substrate.

DESCRIPTION OF EMBODIMENTS

Embodiments of the present disclosure will be described in detail below based on the drawings. The present disclosure is not limited to the embodiments below.

<<First Embodiment of the Invention>>

FIG. 1 to FIG. 11 show the first embodiment of the present disclosure.

Figure 1:
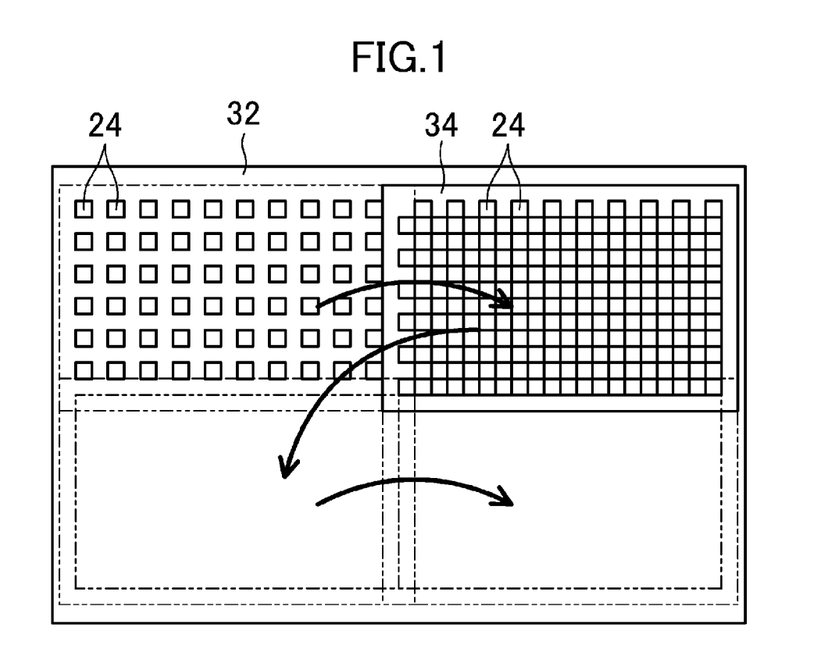
FIG. 1 is a plan view of a second substrate in the process of relocating TFT elements.
Figure 2:
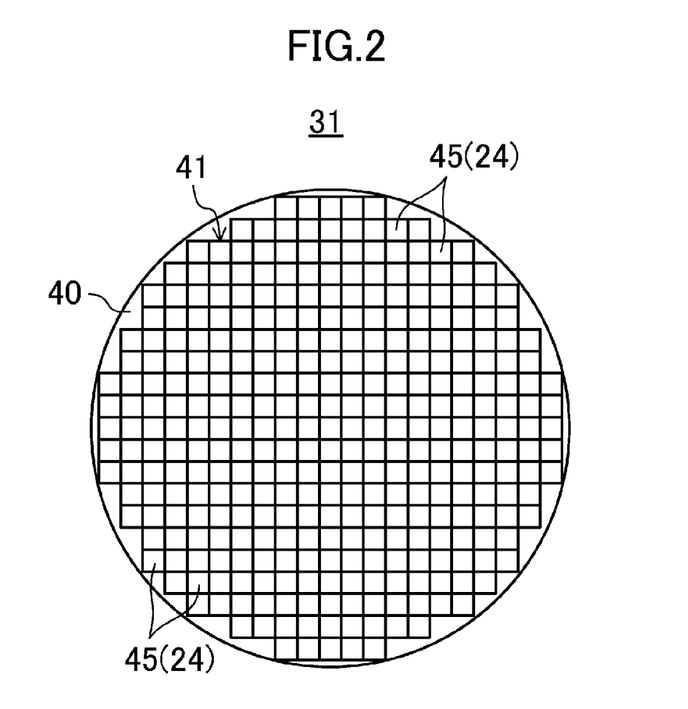
FIG. 2 is a plan view of a first substrate on which a plurality of TFTs are formed.
Figure 3:
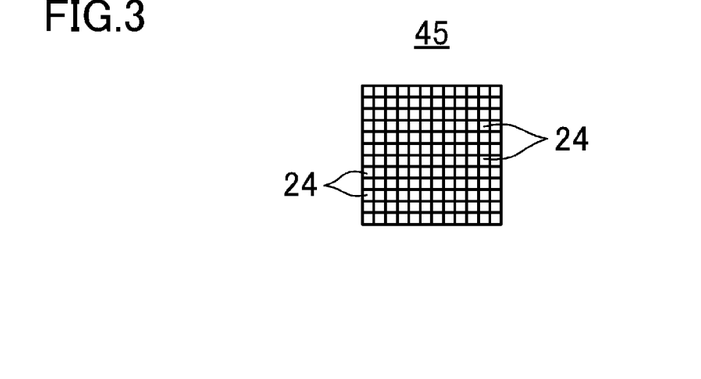
FIG. 3 is a plan view of a unit including the plurality of TFTs.
Figure 4:
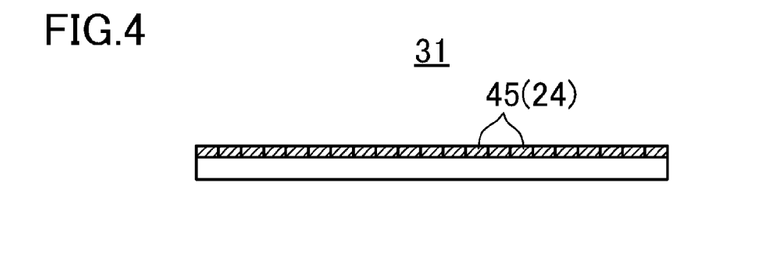
FIG. 4 is a side view of the first substrate on which the plurality of TFTs are formed.
Figure 5:
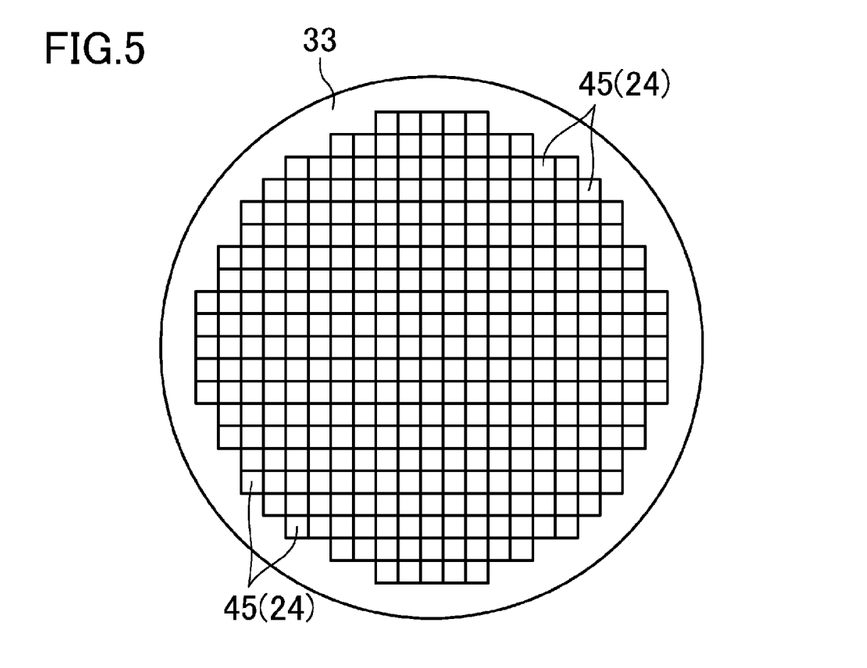
FIG. 5 is a plan view of a holding member holding the plurality of TFTs.
Figure 6:
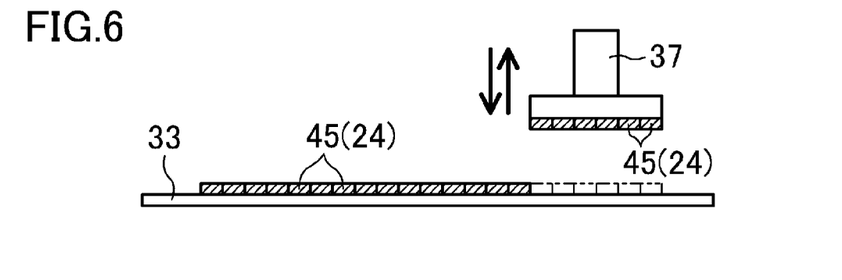
FIG. 6 is a side view of a transfer mechanism which separates the plurality of TFTs from the holding member and transfers the plurality of TFTs.

FIG. 1 is a plan view of a second substrate 32 in the process of relocating TFTs 24. FIG. 2 is a plan view of a first substrate 31 on which a plurality of TFTs 24 are formed. FIG. 3 is a plan view of a unit 45 including the plurality of TFTs 24. FIG. 4 is a side view of the first substrate 31 on which the plurality of TFTs 24 are formed. FIG. 5 is a plan view of a holding member 33 holding the plurality of TFTs 24. FIG. 6 is a side view of a transfer mechanism 37 which separates the plurality of TFTs 24 from the holding member 33 and transfers the plurality of TFTs 24.

Figure 7:
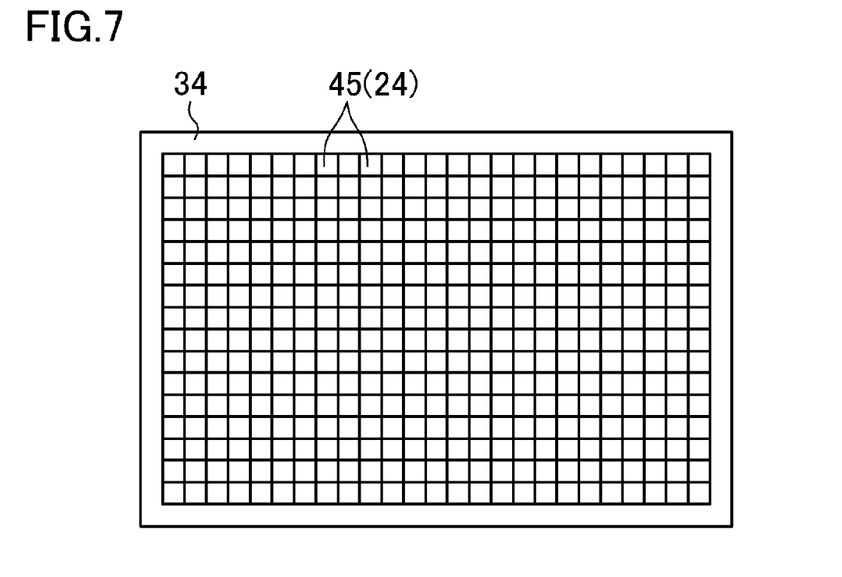
FIG. 7 is a plan view of an intermediate substrate in the process of relocating the TFTs.
Figure 8:
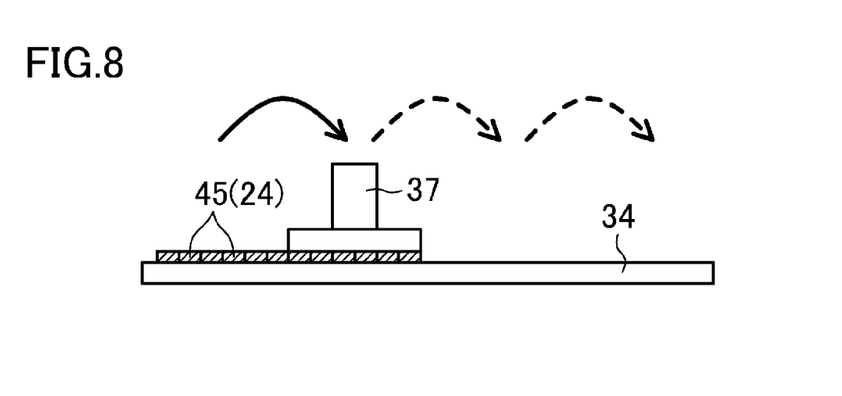
FIG. 8 is a side view of the intermediate substrate in the process of relocating the TFTs.
Figure 9:
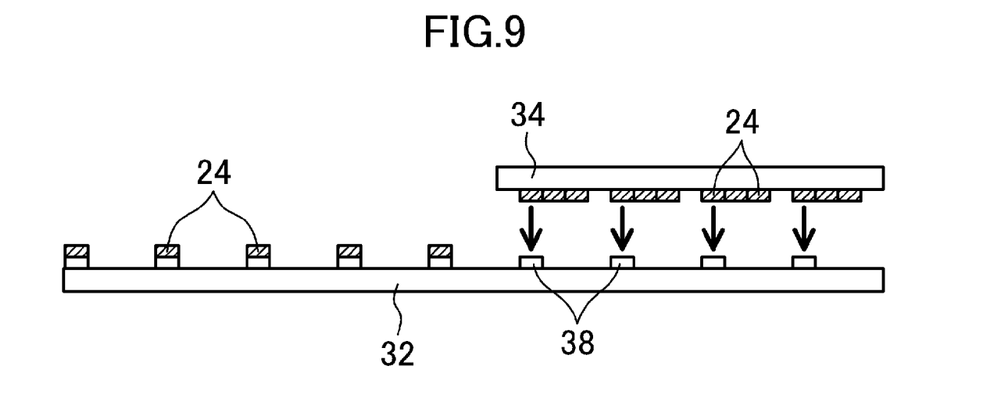
FIG. 9 is a side view of the second substrate in the process of relocating TFTs.
Figure 10:
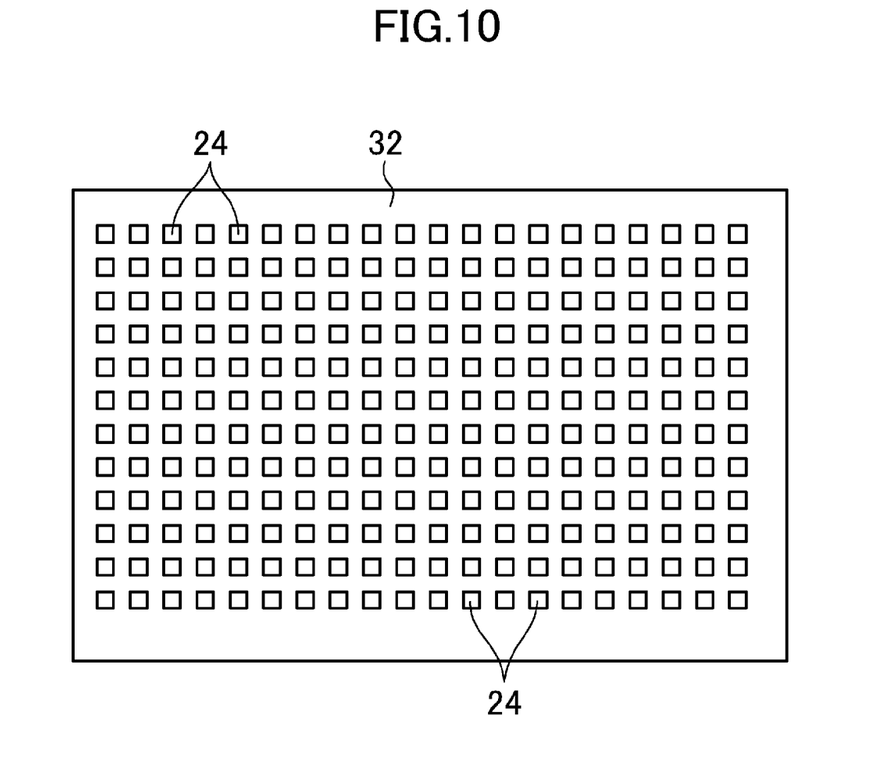
FIG. 10 is a plan view of the second substrate on which the TFTs are dispersed.
Figure 11:
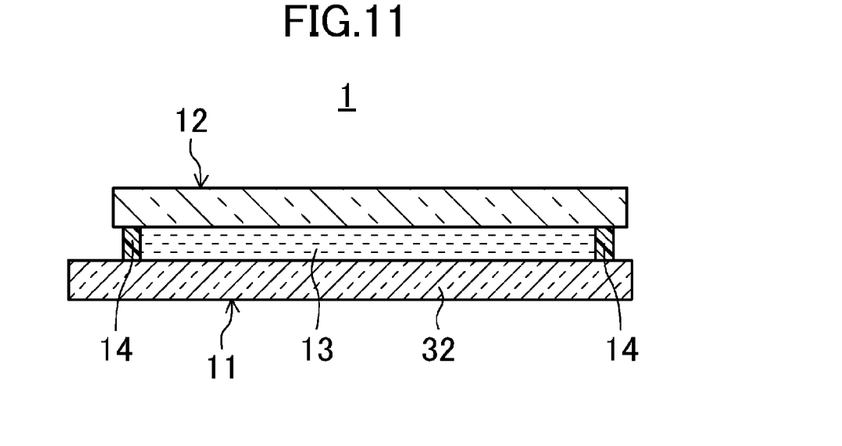
FIG. 11 is a cross-sectional view schematically showing a structure of a liquid crystal display device.
Figure 12:
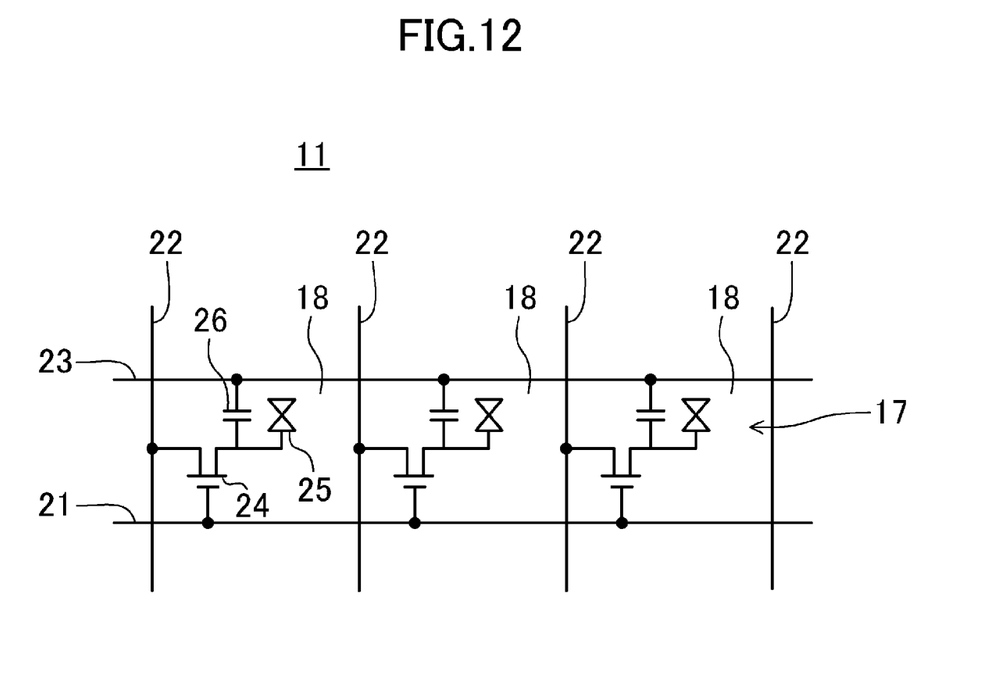
FIG. 12 is a circuit diagram showing a circuit configuration of a TFT substrate.

Further, FIG. 7 is a plan view of an intermediate substrate 34 in the process of relocating the TFTs 24. FIG. 8 is a side view of the intermediate substrate 34 in the process of relocating the TFTs 24. FIG. 9 is a side view of the second substrate 32 in the process of relocating the TFTs 24. FIG. 10 is a plan view of the second substrate 32 on which the TFTs 24 are dispersed. FIG. 11 is a cross-sectional view schematically showing a structure of a liquid crystal display device 1. FIG. 12 is a circuit diagram showing a circuit configuration of a TFT substrate 11.

—Configuration of Liquid Crystal Display Device—

The liquid crystal display device 1 includes, as shown in FIG. 11, a TFT substrate 11 which is an element substrate (a semiconductor device), a counter substrate 12 placed to face the TFT substrate 11, and a liquid crystal layer 13 provided between the TFT substrate 11 and the counter substrate 12. Each of the TFT substrate 11 and the counter substrate 12 is made of a rectangular substrate.

The liquid crystal display device 1 further includes a sealing member 14 provided between the TFT substrate 11 and counter substrate 12 to surround and seal the liquid crystal layer 13. The sealing member 14 is substantially in the form of a rectangular frame, and is made, for example, of a UV/thermally curable resin, such as an acrylic or epoxy-based resin.

The counter substrate 12 includes a color filter (not shown), a common electrode (not shown) made of a transparent conductive film such as ITO, a black matrix (not shown) as a light shield film, etc.

(Configuration of TFT Substrate)

The TFT substrate 11 is a so-called active matrix substrate in which a plurality of pixels 18 are arranged in a matrix. The TFT substrate 11 includes a second substrate 32 made, for example, of a glass substrate, and as shown in FIG. 12, a plurality of gate lines 21 are provided on the second substrate 32 and extend in parallel to each other. Further, a plurality of source lines 22 are provided on the second substrate 32 of the TFT substrate 11, and extend in parallel to each other. The plurality of source lines 22 are arranged orthogonal to the lines 21. Moreover, a plurality of capacity lines 23 are provided on the second substrate 32 of the TFT substrate 11 such that each of the capacity lines 23 is located between adjacent gate lines 21. The capacity lines 23 extend in parallel to each other.

Each of the pixels 18 is formed in a region defined by the source lines 22 and the capacity lines 23, for example. Each of the pixels 18 includes a pixel electrode (not shown) for activating the liquid crystal layer 13, and a thin-film transistor (TFT) 24 for activating the pixel electrode by switching. That is, TFTs 24 as elements are dispersed on the TFT substrate 11.

A source electrode (not shown) of the TFT 24 is connected to a source line 22, and a gate electrode (not shown) of the TFT 24 is connected to a gate line 21. A drain electrode (not shown) of the TFT 24 is connected to the pixel electrode.

In each of the pixels 18, a liquid crystal capacitor 25 is formed between the pixel electrode and the common electrode of the counter substrate 12, and an auxiliary capacitor 26 for maintaining the liquid crystal capacity constant is provided for each of the pixels 18. The auxiliary capacitor 26 is provided between the drain electrode of the TFT 24 and the capacity line 23.

In the liquid crystal display device 1, a scan signal is sent from the gate line 21 to the TFT 24 to turn on the TFT 24, and in this state an image signal is sent to the pixel electrode from the source line 22 through the TFT 24.

—Method for Fabricating TFT Substrate 11 and Liquid Crystal Display Device 1—

Now, a method for fabricating the TFT substrate 11 and a method for fabricating the liquid crystal display device 1 including the TFT substrate 11 will be described.

A method for fabricating the liquid crystal display device 1 includes a step of forming a TFT substrate 11 on which a plurality of TFTs 24 are dispersed, and a step of adhering a counter substrate 12 to the TFT substrate 11 to face the TFT substrate 11.

A method for fabricating the TFT substrate 11 will be described in detail below. First, as shown in FIG. 2, a first element region 41 in which a plurality of TFTs 24 are collectively arranged is formed on the first substrate 31 in the first step. The first substrate 31 is made of a wafer in a circular shape, such as a silicon substrate, for example. As shown in FIG. 4, the plurality of TFTs 24 are formed on one of the surfaces of the first substrate 31.

As shown in FIG. 2 and FIG. 3, a plurality of units 45 each comprised of the plurality of TFTs 24 arranged in a matrix are formed on the first substrate 31. The first element region 41 is formed in a substantially circular shape as shown in FIG. 2. Further, the outline of the first element region 41 is defined by a line extending, while being bent, along the arcuate outline of the first substrate 31. The region of the first substrate 31 where no first element region 41 is formed is an empty region 40.

Next, in the second step, as shown in FIG. 5 and FIG. 6, the plurality of TFTs 24 formed on the first substrate 31 are relocated to the holding member 33 in the same arrangement as in the first element region 41, and are held on the holding member 33. The holding member 33 is made, for example, of hold tape for dicing, and the area of the holding member 33 is slightly larger than the area of the first substrate 31. One surface of the holding member 33 is an adhesive face having adhesiveness. In this embodiment, a holding member in a circular shape, for example, is used.

Then, the adhesive face of the holding member 33 is adhered to the surface of the first substrate 31 on which the TFTs 24 are formed. After that, the other surface of the first substrate 31 held on the holding member 33, that is, the surface opposite to the surface on which the TFTs 24 are formed, is removed by etching or grinding using a grinding device, etc. As a result, only the plurality of TFTs 24 are left on the holding member 33.

Next, in the third step, the plurality of TFTs 24 held on the holding member 33 are rearranged and held on the intermediate substrate 34. Consequently, as shown in FIG. 7, a second element region 42 having a shape different from the shape of the first element region 41 is formed on the intermediate substrate 34.

Specifically, as shown in FIG. 5 to FIG. 8, the plurality of TFTs 24 held on the holding member 33 are divided into a plurality of units 45, and the plurality of TFTs 24 are relocated from the holding member 33 to the intermediate substrate 34 on the unit 45 basis.

In the third step, the plurality of TFTs 24 are transferred from the holding member 33 to the intermediate substrate 34, using a transfer mechanism 37. The transfer mechanism 37 holds the plurality of TFTs 24 by vacuum contact, or using a resin having adhesiveness.

The intermediate substrate 34 has a rectangular shape like the second substrate 32, and is different in shape from the first substrate 31 which is a circular wafer. Further, the area of the intermediate substrate 34 is substantially equal to or larger than the area of the holding member 33. If the area of the intermediate substrate 34 is larger than the area of the holding member 33, the plurality of TFTs 24 held on a plurality of holding members 33 are held on one intermediate substrate 34.

Further, an UV peeling resin, for example, is applied to the intermediate substrate 34 so that the plurality of TFTs 24 are adhered to the intermediate substrate 34 and held on the intermediate substrate 34 via the UV peeling resin. As the UV peeling resin, acrylic resin to which silicon(meth)acrylate is added, an adhesive whose adhesiveness is reduced when irradiated with ultraviolet rays, etc., are used.

The size of the rectangular second element region 42 obtained in this manner is 1/n (where n is a natural number) of the entire part of the region of the second substrate 32 where the TFTs 24 are eventually placed (that is, the pixel region).

Next, in the fourth step, the plurality of TFTs 24 held on the intermediate substrate 34 are dispersed and adhered to the second substrate 32.

Specifically, as shown in FIG. 9, a plurality of islands 38 are placed on a surface of the second substrate 32, which is made of a transparent substrate such as a glass substrate, such that the islands 38 are arranged in a matrix with predetermined intervals from one another, and protrude from the surface of the second substrate 32. Further, an adhesive resin is applied to the top face of each of the islands 38. For example, an acrylate-based UV curing resin, and a UV curing epoxy-based resin are used as the adhesive resin.

Then, as shown in FIG. 1 and FIG. 9, the second substrate 32 is divided into substantially n regions (four regions in FIG. 1), and the intermediate substrate 34 is successively positioned to face the regions of the second substrate 32 to allow some of the TFTs 24 held on the intermediate substrate 34 to be relocated to the second substrate 32. Specifically, the adhesive resin provided on each of the islands 38 facing the TFTs 24 to be relocated from the positioned intermediate substrate 34 is irradiated with ultraviolet rays through a photomask to partially cure the adhesive resin on the islands 38 and increase the adhesiveness of the adhesive resin. In this state, the partially-cured adhesive resin is pushed against the TFTs 24, thereby adhering the TFTs 24 to the islands 38 of the second substrate 32.

Next, the region of the intermediate substrate 34 where the to-be-relocated TFTs 24 are placed is selectively irradiated with ultraviolet rays using a photomask, from the surface of the intermediate substrate 34 on which the TFTs 24 are not held, to reduce the adhesiveness of the UV peeling resin of the region where the to-be-relocated TFTs 24 are placed. As a result, the adhesiveness between the TFTs 24 and the intermediate substrate 34 is reduced, and the adhesiveness between the TFTs 24 and the second substrate 32 is increased. This allows the TFTs 24 to be relocated from the intermediate substrate 34 to the second substrate 32.

After that, the intermediate substrate 34 is moved to the next region and positioned, and some of the plurality of TFTs 24 are relocated and dispersed on this region in a similar manner as above. By repeating this, the TFTs 24 are dispersed throughout the second substrate 32 as shown in FIG. 10. As a result, the second element region 42 is formed.

After that, pixel electrodes and other wires, etc., are formed on the second substrate 32 by photolithography, etc., to fabricate the TFT substrate 11.

—Advantages of the First Embodiment—

As described above, according to the first embodiment, the TFTs 24 which are collectively formed on the first substrate 31 are held on the holding member 33 in the same arrangement as on the first substrate 31, and thereafter, the TFTs 24 are rearranged and held on the intermediate substrate 34, from which the TFTs 24 are relocated to the second substrate 32. This means that the shape of first element region 41 formed on the first substrate 31 is not limited to the shape of the second element region 42 to be formed on the second substrate 32. As a result, it is possible to form the TFTs 24 on the relatively small first substrate 31 with high accuracy, and possible to form the TFTs 24 on a larger area of the first substrate 31 with efficiency. That is, it is possible to reduce the area of the empty region 40 of the first substrate 31 for efficient use of the first substrate 31, and possible to reduce the fabrication cost.

Further, since it is possible to use a relatively large intermediate substrate 34, and the intermediate substrate 34 can hold a lot of TFTs 24 transferred from a plurality of first substrates 31, it is possible to reduce the number of positioning movements between the holding member 33 and the second substrate 32. Thus, it is possible to significantly improve the throughput in the fabrication of the TFT substrate 11 and the liquid crystal display device 1.

<<Second Embodiment of the Invention>>

Figure 13:
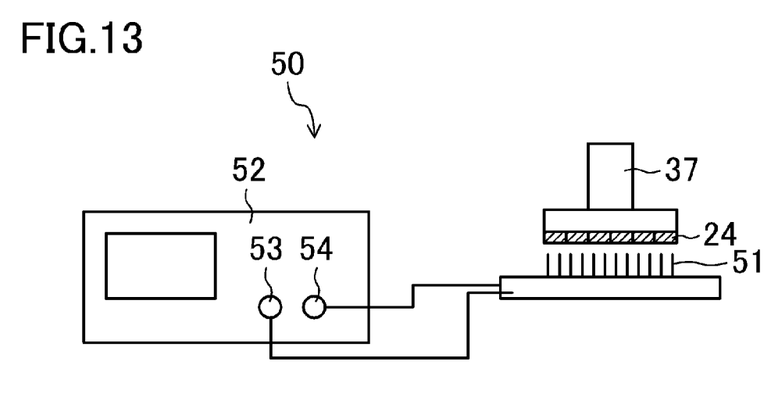
FIG. 13 is a side view schematically showing a configuration of a test device.
Figure 14:
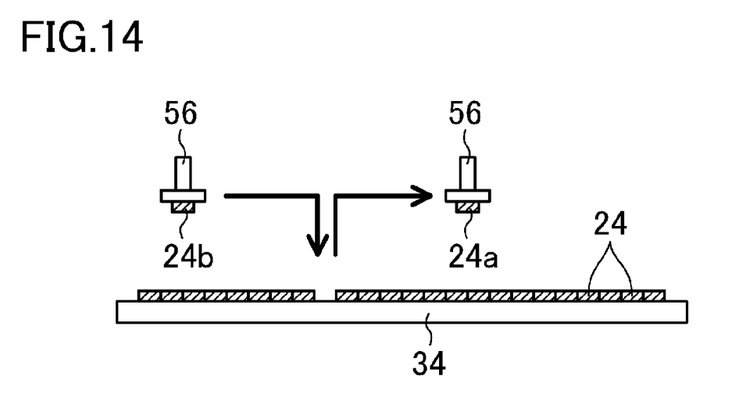
FIG. 14 is a side view of the second substrate on which a faulty TFT is replaced with a normal TFT.

FIG. 13 and FIG. 14 show the second embodiment of the present disclosure. In the following embodiments, like reference characters have been used to designate the same elements as those shown in FIG. 1 to FIG. 12, and detailed explanation thereof is omitted.

FIG. 13 is a side view schematically showing a configuration of a test device 50. FIG. 14 is a side view of a second substrate 32 on which a faulty TFT 24 is replaced with a normal TFT 24.

In the second embodiment, the plurality of TFTs 24 in the first embodiment are checked for any faulty TFT.

A method for fabricating a TFT substrate 11 of the second embodiment includes a step of checking the plurality of TFTs 24 held on the transfer mechanism 37 for any faulty TFT, as shown in FIG. 13, in the third step of the first embodiment. The check of the TFTs 24 is performed using a test device 50 having a check probe 51, and a measuring machine 52 connected to the check probe 51.

The measuring machine 52 has an output unit 53 which outputs a check voltage to the check probe 51, and an input unit 54 which receives an output signal from the check probe 51. The check probe 51 is configured to apply a predetermined check voltage to each of the TFTs 24 of a unit 45 held on the transfer mechanism 37.

Output signals from the TFTs 24 are measured by the measuring machine 52 using the check probe 51. Then, based on the signal values measured, it is determined whether or not the TFTs 24 are faulty elements which do not operate properly. After that, the plurality of TFTs 24 held on the transfer mechanism 37 are adhered and relocated to the intermediate substrate 34 as shown in FIG. 7 and FIG. 8.

After this third step, a correcting step is performed on the plurality of TFTs 24 held on the intermediate substrate 34 to replace a TFT 24a detected as a faulty TFT in the checking step with a normal TFT 24b.

Specifically, as shown in FIG. 14, the TFT 24a detected as a faulty TFT in the checking step is removed from the intermediate substrate 34 by holding it with a holding jig 56 and separating it from the intermediate substrate 34. A normal TFT 24b is placed and held on the intermediate substrate 34 at a location where the faulty TFT 24a is used to be placed, using the holding jig 56. After that, the fourth step is performed as in the first embodiment to fabricate the TFT substrate 11.

It is very difficult to repair a fault after all the TFTs 24 are relocated to the second substrate 32 and connected to the wire circuit. However, in the second embodiment, a checking step is performed on the plurality of TFTs 24 held on the transfer mechanism 37 on the unit 45 basis, to check for any faulty TFT when the plurality of TFTs 24 are transferred from the holding member 33 to the intermediate substrate 34 in the third step. The fault check can be efficiently performed because the number of the TFTs 24 held on the transfer mechanism 37 is significantly smaller than the number of TFTs 24 eventually placed on the second substrate 32. As a result, it is possible to increase yields of the TFT substrate 11 and the liquid crystal display device 1 as a product.

<<Third Embodiment of the Invention>>

Figure 15:
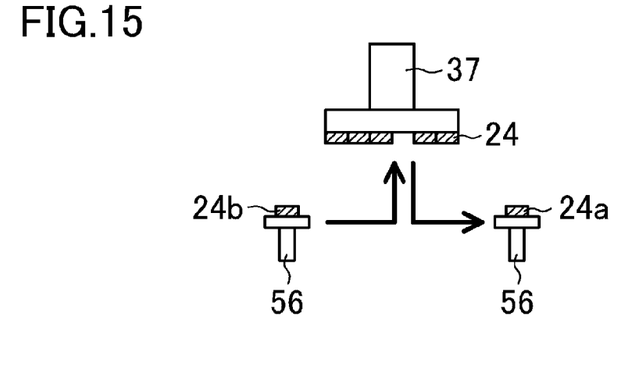
FIG. 15 is a side view of the transfer mechanism on which a faulty TFT is replaced with a normal TFT.

FIG. 15 shows the third embodiment of the present disclosure.

FIG. 15 is a side view of a transfer mechanism 37 on which a faulty TFT 24 is replaced with a normal TFT 24.

In the second embodiment, a faulty TFT 24a is replaced on the second substrate 32 after the TFTs 24 are relocated to the second substrate 32. However, in the third embodiment, a faulty TFT 24a is replaced before the TFTs 24 are relocated to the second substrate 32.

Specifically, in the third embodiment, a checking step is performed on the plurality of TFTs 24 held on the transfer mechanism 37 to check for any faulty TFT 24 in the third step as shown in FIG. 13, similar to the second embodiment. After that, in this third step, a correcting step is performed on the plurality of TFTs 24 held on the transfer mechanism 37 to replace a TFT 24a detected as a faulty TFT in the checking step with a normal TFT 24b as shown in FIG. 15.

In this correcting step, the TFT 24a detected as a faulty TFT is removed from the transfer mechanism 37 by holding it with a holding jig 56 and separating it from the transfer mechanism 37 as shown in FIG. 15. A normal TFT 24b is placed and held on the transfer mechanism 37 at a location where the faulty TFT 24a is used to be placed, using the holding jig 56. Thereafter, the plurality of TFTs 24 held on the transfer mechanism 37 are adhered and relocated to the intermediate substrate 34 as shown in FIG. 7 and FIG. 8. Then, the fourth step is performed as in the first embodiment to fabricate the TFT substrate 11.

Thus, according to the third embodiment, similar to the second embodiment, a checking step is performed on the plurality of TFTs 24 held on the transfer mechanism 37 on the unit 45 basis to check for any fault. The fault check can be efficiently performed because the number of the TFTs 24 held on the transfer mechanism 37 is significantly smaller than the number of TFTs 24 eventually placed on the second substrate 32. As a result, it is possible to increase yields of the TFT substrate 11 and the liquid crystal display device 1 as a product.

Moreover, since the faulty TFT 24a detected in the checking step is replaced with the normal TFT 24b on the unit 45 basis including a plurality of TFTs 24 held on the transfer mechanism 37, it becomes easy to perform the replacement process and it is possible to improve the throughput.

<<Other Embodiments>>

In the first to third embodiments, the TFT substrate 11 including TFT elements is described as an example element substrate, but the present disclosure is not limited to the TFT substrate 11, and can be applied to an element substrate including other elements, as well. For example, the element substrate may be configured as a substrate including an element which is any one of a TFT, a circuit having a TFT, a light emitting element, a light receiving element, a power generating element, and a piezoelectric element, or an element or a circuit comprised of a combination of two or more of the TFT, the circuit having a TFT, the light emitting element, light receiving element, the power generating element, and the piezoelectric element.

Further, the TFT substrate 10 is described as an example semiconductor device, but the present disclosure is not limited to the TFT substrate 10, and can also be applied to other devices, such as a large-area sensor sheet for detecting a pressure, for example. Further, the liquid crystal display device 1 is described as an example display device, but the present disclosure is not limited to the liquid crystal display device 1, and can also be applied to other display devices, such as an organic EL display device, for example.

INDUSTRIAL APPLICABILITY

As described above, the present disclosure is useful as a method for fabricating a semiconductor device, and a method for fabricating a display device.

DESCRIPTION OF REFERENCE CHARACTERS

1 liquid crystal display device (display device)
11 TFT substrate (semiconductor device)
12 counter substrate
24 TFT (element)
24a faulty TFT
24b normal TFT
31 first substrate
32 second substrate
33 holding member
34 intermediate substrate
37 transfer mechanism
41 first element region
42 second element region
45 unit

The invention claimed is:

1. A method for fabricating a semiconductor device in which a plurality of elements are dispersed, the method comprising:
    a first step of forming, on a first substrate, a first element region in which the plurality of elements are collectively arranged;
    a second step of relocating the plurality of elements formed on the first substrate to a holding member in the same arrangement as in the first element region to have the plurality of elements held on the holding member;
    a third step of rearranging the plurality of elements held on the holding member and having the plurality of elements held on an intermediate substrate, thereby forming a second element region having a shape different from a shape of the first element region on the intermediate substrate; and
    a fourth step of dispersing the plurality of elements held on the intermediate substrate and adhering the plurality of elements to a second substrate,
    wherein each of the plurality of elements is any one of a thin film transistor, a circuit including the thin film transistor, a light emitting element, a light receiving element, a power generating element, and a piezoelectric element, or an element or a circuit comprised of a combination of two or more of the thin film transistor, the circuit including the thin film transistor, the light emitting element, the light receiving element, the power generating element, and the piezoelectric element.

2. The method for fabricating the semiconductor device of claim 1, wherein
    in the third step, the plurality of elements held on the holding member are divided into a plurality of units, and the plurality of elements are relocated from the holding member to the intermediate substrate on the unit basis.

3. The method for fabricating the semiconductor device of claim 1, wherein
    the intermediate substrate is in a shape different from a shape of the first substrate.

4. The method for fabricating the semiconductor device of claim 1, wherein
    in the third step, the holding member includes a plurality of holding members, and the plurality of elements held on each of the plurality of holding members are held on the single intermediate substrate.

5. The method for fabricating the semiconductor device of claim 1, wherein
    in the third step, the plurality of elements are transferred from the holding member to the intermediate substrate by a transfer mechanism, and a checking step is performed on the plurality of elements held on the transfer mechanism to check for any faulty element in the plurality of elements.

6. The method for fabricating the semiconductor device of claim 5, wherein
    in the third step, a correcting step is performed on the plurality of elements held on the transfer mechanism to replace an element detected as a faulty element in the checking step with a normal element.

7. The method for fabricating the semiconductor device of claim 5, wherein
after the third step, a correcting step is performed on the plurality of elements held on the intermediate substrate to replace an element detected as a faulty element in the checking step with a normal element.

8. A method for fabricating a display device, comprising:
forming an element substrate in which a plurality of elements are dispersed;
and adhering a counter substrate to the element substrate to face the element substrate, wherein the forming the element substrate includes a first step of forming, on a first substrate, a first element region in which the plurality of elements are collectively arranged, a second step of relocating the plurality of elements formed on the first substrate to a holding member in the same arrangement as in the first element region to have the plurality of elements held on the holding member, a third step of rearranging the plurality of elements held on the holding member and having the plurality of elements held on an intermediate substrate, thereby forming a second element region having a shape different from a shape of the first element region on the intermediate substrate, and
a fourth step of dispersing the plurality of elements held on the intermediate substrate and adhering the plurality of elements to a second substrate,
wherein each of the plurality of elements is any one of a thin film transistor, a circuit including the thin film transistor, a light emitting element, a light receiving element, a power generating element, and a piezoelectric element, or an element or a circuit comprised of a combination of two or more of the thin film transistor, the circuit including the thin film transistor, the light emitting element, the light receiving element, the power generating element, and the piezoelectric element.

9. The method for fabricating the display device of claim 8, wherein
in the third step, the plurality of elements held on the holding member are divided into a plurality of units, and the plurality of elements are relocated from the holding member to the intermediate substrate on the unit basis.

10. The method for fabricating the display device of claim 8, wherein
the intermediate substrate is in a shape different from a shape of the first substrate.

11. The method for fabricating the display device of claim 8, wherein
in the third step, the holding member includes a plurality of holding members, and the plurality of elements held on each of the plurality of holding members are held on the single intermediate substrate.

12. The method for fabricating the display device of claim 8, wherein
in the third step, the plurality of elements are transferred from the holding member to the intermediate substrate by a transfer mechanism, and a checking step is performed on the plurality of elements held on the transfer mechanism to check for any faulty element in the plurality of elements.

13. The method for fabricating the display device of claim 12, wherein
in the third step, a correcting step is performed on the plurality of elements held on the transfer mechanism to replace an element detected as a faulty element in the checking step with a normal element.

14. The method for fabricating the display device of claim 12, wherein
after the third step, a correcting step is performed on the plurality of elements held on the intermediate substrate to replace an element detected as a faulty element in the checking step with a normal element.

* * * * *